(12) United States Patent
Mao

(10) Patent No.: US 10,292,284 B1
(45) Date of Patent: May 14, 2019

(54) ANTI-FALLING MECHANISM FOR PREVENTING AN ELECTRONIC COMPONENT INSTALLED INSIDE A CASING FROM FALLING RAPIDLY AND ELECTRONIC DEVICE THEREWITH

(71) Applicant: Wistron Corporation, New Taipei (TW)

(72) Inventor: Zhong-Hui Mao, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/983,066

(22) Filed: May 17, 2018

(30) Foreign Application Priority Data

Feb. 9, 2018 (CN) .......................... 2018 1 0135016

(51) Int. Cl.
| H05K 7/02 | (2006.01) |
| H05K 7/04 | (2006.01) |
| H05K 5/02 | (2006.01) |
| F16H 19/04 | (2006.01) |

(52) U.S. Cl.
CPC ........... *H05K 5/0217* (2013.01); *F16H 19/04* (2013.01); *H05K 5/023* (2013.01); *H05K 5/0247* (2013.01)

(58) Field of Classification Search
USPC ...................................................... 361/809
See application file for complete search history.

(56) References Cited

U.S. PATENT DOCUMENTS

| 4,914,552 | A | * | 4/1990 | Kecmer | ............... | H05K 7/1404 |
| | | | | | | 211/41.17 |
| 6,952,349 | B2 | * | 10/2005 | Gough | ................. | H05K 7/1488 |
| | | | | | | 361/741 |
| 8,714,670 | B2 | * | 5/2014 | Kuo | ...................... | H05K 7/1489 |
| | | | | | | 312/223.1 |
| 9,304,557 | B2 | * | 4/2016 | Herman | .................. | G06F 1/181 |
| 9,826,658 | B1 | * | 11/2017 | Mao | .................... | H05K 7/1487 |
| 2015/0077920 | A1 | * | 3/2015 | Zhu | ...................... | H05K 7/1487 |
| | | | | | | 361/679.31 |

* cited by examiner

Primary Examiner — Hung S. Bui
(74) Attorney, Agent, or Firm — Winston Hsu

(57) ABSTRACT

The present disclosure relates to an anti-falling mechanism for preventing an electronic component installed inside a casing from falling rapidly. The anti-falling mechanism includes at least one damping gear and at least one gear rack. The at least one damping gear is disposed on the electronic component. The at least one gear rack is disposed at a position corresponding to the at least one damping gear. The at least one damping gear rotatably engages with the at least one gear rack when installing the electronic component inside the casing along a first direction at least. Therefore, even if the electronic component falls unintentionally during installation or disassembly, rotary engagement of the at least one damping gear and the at least one gear rack can reduce kinetic energy of the falling electronic component, which effectively prevents the electronic component from colliding with other components inside the casing.

20 Claims, 15 Drawing Sheets

ANTI-FALLING MECHANISM FOR PREVENTING AN ELECTRONIC COMPONENT INSTALLED INSIDE A CASING FROM FALLING RAPIDLY AND ELECTRONIC DEVICE THEREWITH

BACKGROUND OF THE INVENTION

1. Field of the Invention

The present disclosure relates to an installation assistance mechanism and an electronic device therewith, and more particularly, to an anti-falling mechanism which can reduce kinetic energy of the falling electronic component by rotary engagement of a damping gear and a gear rack for preventing an electronic component installed inside a casing from falling rapidly, and an electronic device therewith.

2. Description of the Prior Art

With the trend of thin and lightweight design of electronic devices, in order to maximize storage capacity and computational efficiency in a limited space of an electronic device, electronic components in the electronic device are often stacked inside a casing to fully and effectively utilize internal mechanical space of the casing. However, when there is a great height difference between the casing and the electronic component, the casing becomes obstruction which makes it difficult for a user to install the electronic component inside the casing. The electronic component also may accidentally fall and may collide with other components located beneath during installation of the electronic component, which may cause structural or functional damage.

SUMMARY OF THE INVENTION

Therefore, it is an objective of the present disclosure to provide an anti-falling mechanism which can reduce kinetic energy of the falling electronic component by rotary engagement of a damping gear and a gear rack for preventing an electronic component installed inside a casing from falling rapidly, and an electronic device therewith for solving the aforementioned problems.

In order to achieve the aforementioned objective, the present disclosure discloses an anti-falling mechanism for preventing an electronic component installed inside a casing from falling rapidly. The anti-falling mechanism includes at least one damping gear and at least one gear rack. The at least one damping gear is disposed on the electronic component. The at least one gear rack is disposed at a position corresponding to the at least one damping gear. The at least one damping gear rotatably engages with the at least one gear rack for reducing kinetic energy of the falling electronic component when the electronic component is being installed inside the casing at least along a first direction.

In order to achieve the aforementioned objective, the present disclosure further discloses an electronic device including a casing, a baseplate, an electronic component and at least one anti-falling mechanism. The baseplate is disposed inside the casing. The electronic component is detachably disposed inside the casing and located above the baseplate. The at least one anti-falling mechanism is for preventing the electronic component from collision due to rapid falling of the electronic component during installation or detachment of the electronic component. The at least one anti-falling mechanism includes at least one damping gear and at least one gear rack. The at least one damping gear is disposed on the electronic component. The at least one gear rack is disposed at a position corresponding to the at least one damping gear. The at least one damping gear rotatably engages with the at least one gear rack for reducing kinetic energy of the falling electronic component when the electronic component is being installed inside the casing at least along a first direction.

In summary, the present disclosure utilizes rotary engagement of the damping gear and the gear rack for reducing the kinetic energy of the falling electronic component. In such a way, even if the electronic component accidentally falls during installation, the electronic component may fall downwardly in a slow and steady speed. Since the kinetic energy of the falling electronic component is reduced, it may prevent the electronic component and other component located beneath from collision damage, which may improve assembly yield. Furthermore, the present disclosure further utilizes cooperation of the first guiding structure and the second guiding structure for guiding the damping gear to rotatably engage with the gear rack. Therefore, it is convenient in use. Besides, the present disclosure further utilizes the supporting structure and the operating handle for mating the first electrical connector and the second electrical connector. As the electronic component falls in the slow and steady speed, the supporting structure on the casing may abut against the opening end of the slot structure of the operating handle. At this moment, the second electrical connector of the electronic component is separated from the first electrical connector disposed on the baseplate. Afterwards, when the operating handle is pivoted to drive the electronic component to move toward the baseplate and to drive supporting structure to move toward the closed end of the slot structure, the second electrical connector of the electronic component is driven to mate with the first electrical connector disposed on the baseplate. Therefore, it may effectively prevent the first electrical connector and the second electrical connector from collision damage during installation.

These and other objectives of the present disclosure will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure (s) being described. The components of the present disclosure can be positioned in a number of different orientations. As such, the directional terminology is used for purposes of illustration and is in no way limiting. Accordingly, the drawings and descriptions will be regarded as illustrative in nature and not as restrictive.

Figure 1:
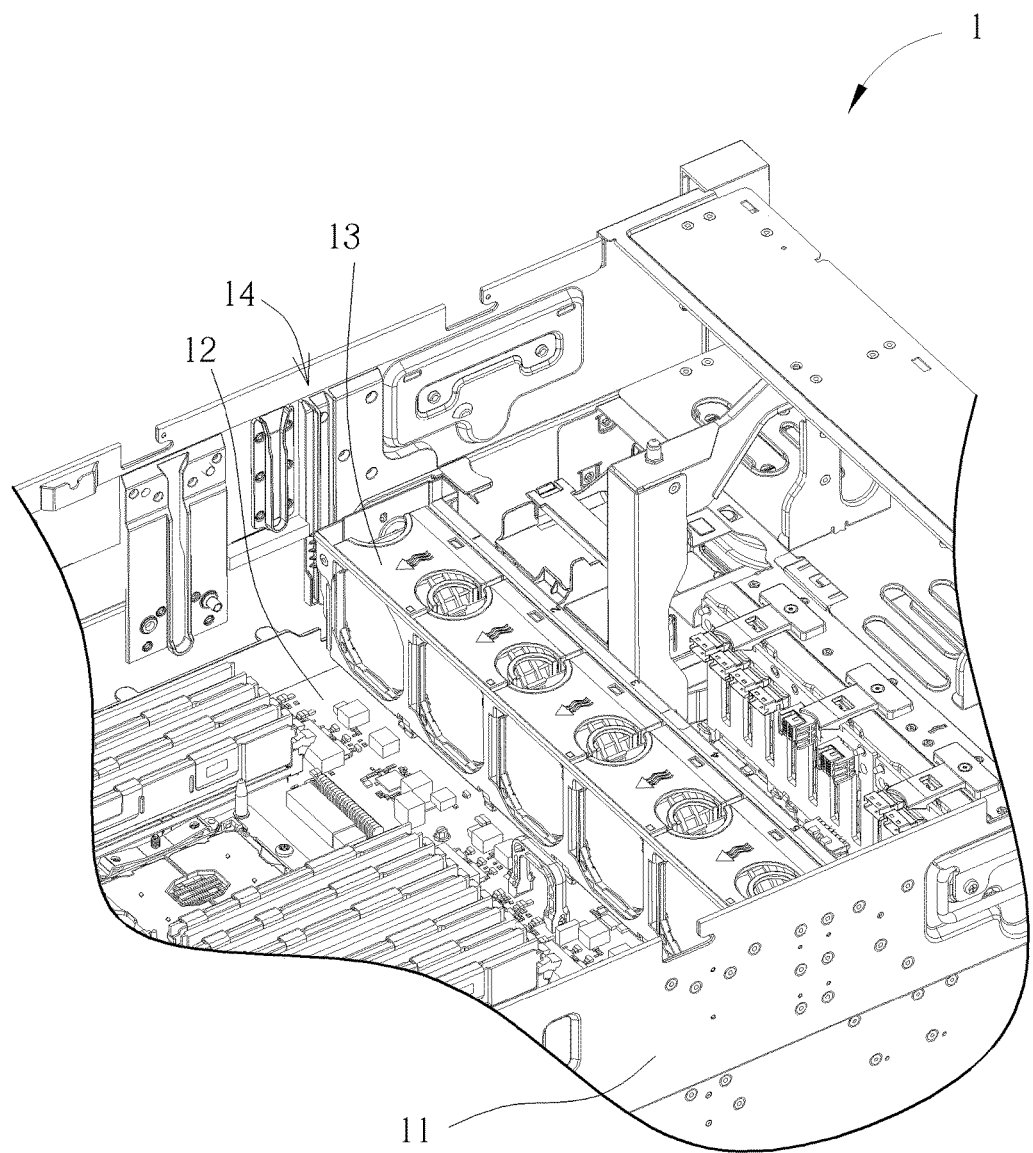
FIG. 1 is a partial internal structural diagram of an electronic device according to a first embodiment of the present disclosure.
Figure 2:
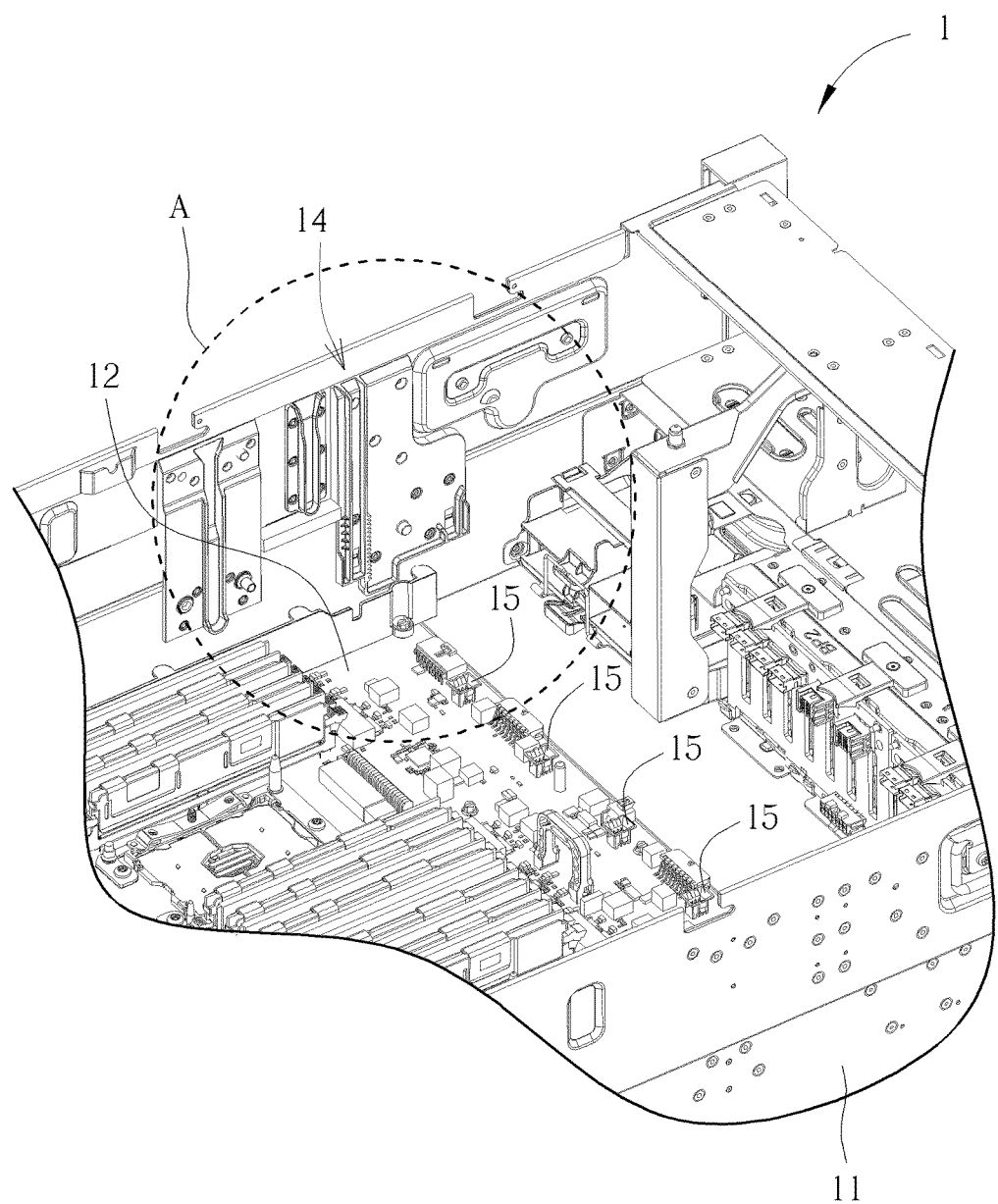
FIG. 2 is another partial internal structural diagram of the electronic device according to the first embodiment of the present disclosure.

Refer to FIG. 1 and FIG. 2. FIG. 1 is a partial internal structural diagram of an electronic device 1 according to a first embodiment of the present disclosure. FIG. 2 is another partial internal structural diagram of the electronic device 1 according to the first embodiment of the present disclosure. As shown in FIG. 1 and FIG. 2, the electronic device 1 includes a casing 11, a baseplate 12, an electronic component 13 and two anti-falling mechanisms 14. The baseplate 12 is disposed inside the casing 11 and located at a bottom portion of the casing 11. The electronic component 13 is detachably installed inside the casing 11 and located above the baseplate 12. As shown in FIG. 1, the electronic component 13 is installed on the baseplate 12. As shown in FIG. 2, the electronic component 13 is detached from the baseplate 12. The two anti-falling mechanisms 14 are located at two opposite sides of the electronic component 13 for preventing the electronic component 13 from rapidly falling, which can prevent the electronic component 13, the baseplate 12, or other components from collision damage during installation or disassembly. However, the number and the configuration of the anti-falling mechanism 14 are not limited thereto. It depends on practical demands. For example, in another embodiment, the electronic device 1 also may include only one anti-falling mechanism 14 disposed on one side or a middle portion of the electronic component 13. Furthermore, in this embodiment, the baseplate 12 may be a circuit board. The electronic component 13 may be a fan module including a plurality of fan units. However, it is not limited thereto.

Figure 3:
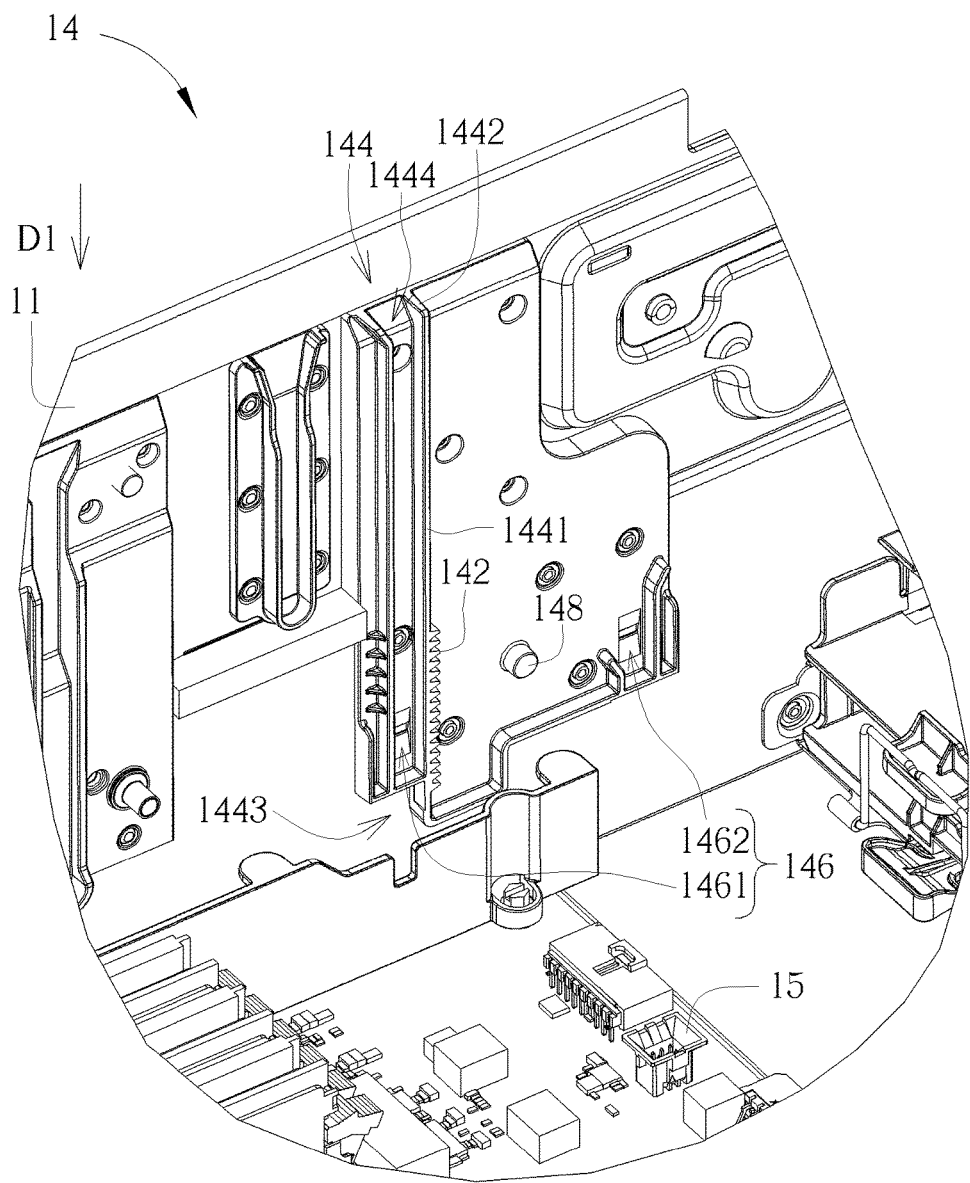
FIG. 3 is an enlarged diagram of an "A" portion shown in FIG. 2 according to the first embodiment of the present disclosure.
Figure 4:
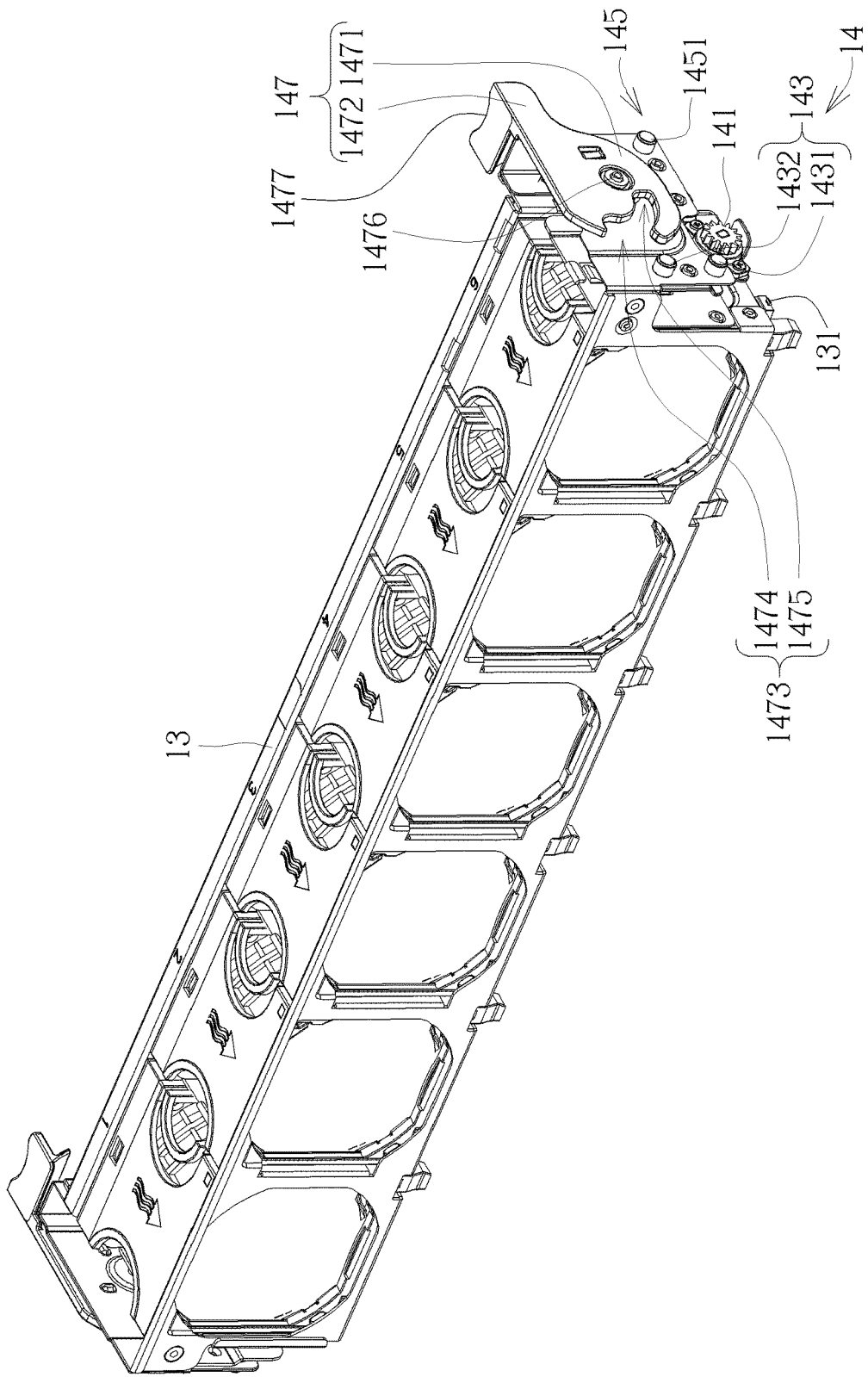
FIG. 4 is a partial structural diagram of an electronic component and an anti-falling mechanism according to the first embodiment of the present disclosure.
Figure 5:
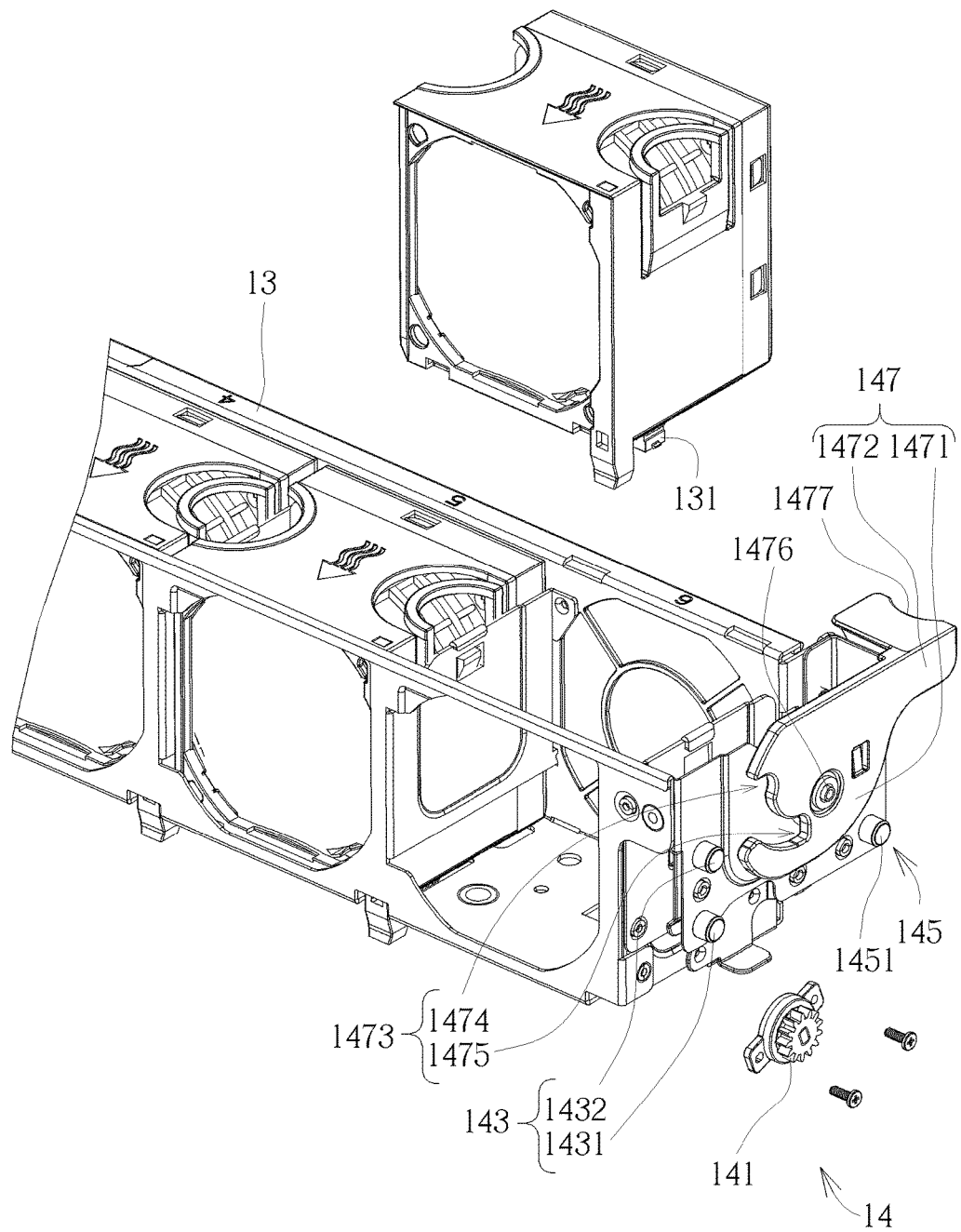
FIG. 5 is a partial exploded diagram of the electronic component and the anti-falling mechanism shown in FIG. 4 according to the first embodiment of the present disclosure.

Refer to FIG. 2 to FIG. 5. FIG. 3 is an enlarged diagram of an "A" portion shown in FIG. 2 according to the first embodiment of the present disclosure. FIG. 4 is a partial structural diagram of the electronic component 13 and the anti-falling mechanism 14 according to the first embodiment of the present disclosure. FIG. 5 is a partial exploded diagram of the electronic component 13 and the anti-falling mechanism 14 shown in FIG. 4 according to the first embodiment of the present disclosure. As shown in FIG. 2 and FIG. 4, the electronic device 1 further includes a plurality of first electrical connectors 15 disposed on the baseplate 12. Each electronic component 13 includes at least one second electrical connector 131. For example, each fan unit of the electronic component 13 may include one second electrical connector 131. When the electronic component 13 is located at an installation position relative to the casing 11 and installed on the baseplate 12, each first electrical connector 15 mates with the corresponding second electrical connector 131 for providing electricity for the electronic component 13 or transmitting signals. Furthermore, as shown in FIG. 3 to FIG. 5, each anti-falling mechanism 14 includes a damping gear 141, a gear rack 142, a first guiding structure 143, a second guiding structure 144, a first positioning structure 145, a second positioning structure 146, an operating handle 147, and a supporting structure 148. The damping gear 141, the first guiding structure 143, and the first positioning structure 145 are disposed on a side of the electronic component 13 adjacent to the casing 11. The gear rack 142, the second guiding structure 144, and the second positioning structure 146 are disposed on an inner side of the casing 11 and located at positions respectively corresponding to the damping gear 141, the first guiding structure 143, and the first positioning structure 145. The first guiding structure 143 and the second guiding structure 144 cooperate with each other for guiding the damping gear 141 to move along a first direction D1 to rotatably engage with the gear rack 142. In this embodiment, the first direction D1 is substantially parallel to a falling direction of the electronic component 13, i.e., the first direction D1 is substantially perpendicular to the bottom portion of the casing 11. When the electronic component 13 falls rapidly, the damping gear 141 may rotatably engage with the gear rack 142 for reducing kinetic energy of the falling electronic component 13 to reduce a falling speed of the electronic component 13.

Specifically, in this embodiment, the first guiding structure 143 includes two guiding columns 1431, 1432. The two guiding columns 1431, 1432 are arranged along the first direction D1. The second guiding structure 144 includes a guiding track 1441 and a trumpet-shaped opening structure 1442. The gear rack 142 is disposed on a side of the guiding track 1441 and located at a position near a lower end 1443 of the guiding track 1441. The guiding track 1441 and the gear rack 142 extend along the first direction D1. The trumpet-shaped opening structure 1442 is connected together with the guiding track 1441 and is configured to guide the two guiding columns 1431, 1432 to enter the guiding track 1441, i.e., an outward expanding opening of the trumpet-shaped opening structure 1442 facilitates the two guiding columns 1431, 1432 to enter into the guiding track 1441. However, the ratio of the guiding track 1441 to the gear rack 142 is not limited to the figures of this embodiment. Understandably, in another embodiment, a length of the gear rack 142 may be equal to a length of the guiding track 1441, i.e., the gear rack 142 extends from a position near an upper end 1444 of the guiding track 1441 to another position near the lower end 1443 of the guiding track 1441. Furthermore, in this embodiment, the first positioning structure 145 may include a positioning column 1451. The second positioning structure 146 may include a first positioning slot structure 1461 and a second positioning slot structure 1462. The first positioning slot structure 1461 may be located at a position corresponding to the guiding column 1431. The second positioning slot structure 1462 may be located at a position corresponding to the positioning column 1451. When the electronic component 13 moves to the installation position along the first direction D1 relative to the casing 11, the guiding column 1431 and the positioning column 1451 abut against the first positioning slot structure 1461 and the second positioning slot structure 1462 respectively for supporting the electronic component 13. However, the first positioning structure 145 and the second positioning structure 146 are not limited to those illustrated in figures of this embodiment. Understandably, in another embodiment, the anti-falling mechanism 14 also may only include the second positioning structure 146, and the second positioning structure 146 may only include the first positioning slot structure 1461. In other words, in this embodiment, when the electronic component 13 is located at the installation position, the electronic component 13 is supported by abutting the guiding column 1431 against the first positioning slot structure 1461.

The operating handle 147 includes a pivoting portion 1471 and an operating portion 1472. The pivoting portion 1471 is pivoted to the side of the electronic component 13 adjacent to the casing 11. The operating portion 1472 extends from the pivoting portion 1471 outwardly along a radius direction of the pivoting portion 1471. The pivoting portion 1471 includes a slot structure 1473. The slot structure 1473 has an opening end 1474 and a closed end 1475. In this embodiment, the slot structure 1473 may preferably be of arc-shaped. A distance between the slot structure 1473 and a pivoting shaft 1476 of the pivoting portion 1471 gradually decreases from the opening end 1474 to the closed end 1475. A distance between an end 1477 of the operating portion 1472 and the pivoting shaft 1476 of the pivoting portion 1471 is substantially greater than a distance between any position of the slot structure 1473 and the pivoting shaft 1476 of the pivoting portion 1471. The supporting structure 148 is disposed on the inner side of the casing 11 and located at a position corresponding to the slot structure 1473. When the electronic component 13 falls along the first direction D1, the supporting structure 148 may cooperate with the operating handle 147 for providing a two-stage operation of mating the first electrical connectors 15 and the second electrical connectors 131, which may prevent the first electrical connectors 15 and the second electrical connectors 131 collision damage. Besides, a structural design that the distance between the end 1477 of the operating portion 1472 and the pivoting shaft 1476 of the pivoting portion 1471 is greater than the distance between any position of the slot structure 1473 and the pivoting shaft 1476 of the pivoting portion 1471, may effectively extend a force arm of the operating handle 147, which makes it easy for a user to pivot the pivoting portion 1471 by the operating portion 1472.

Figure 6:
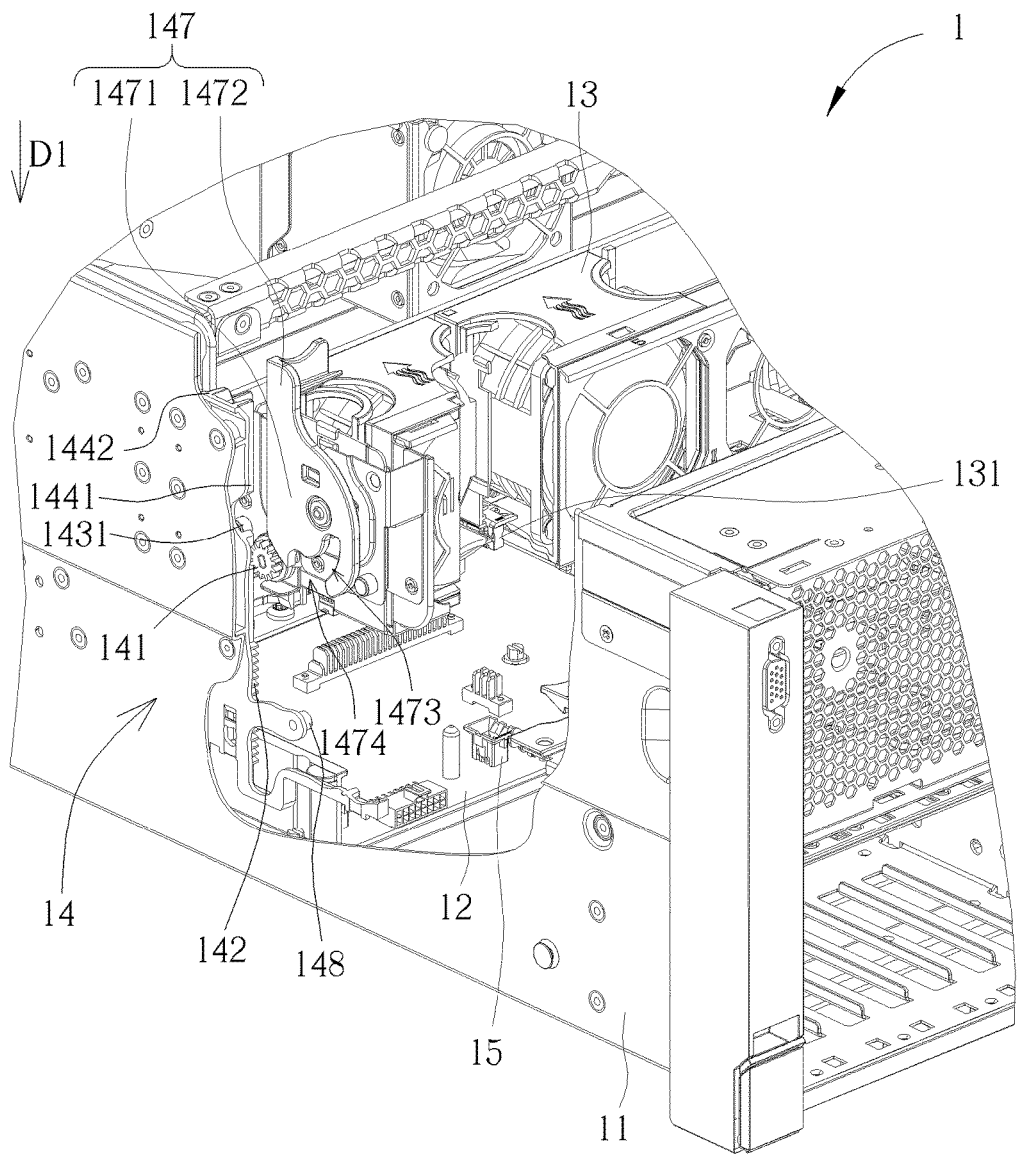
FIG. 6 to FIG. 10 are diagrams of the electronic device in different states according to the first embodiment of the present disclosure.
Figure 7:
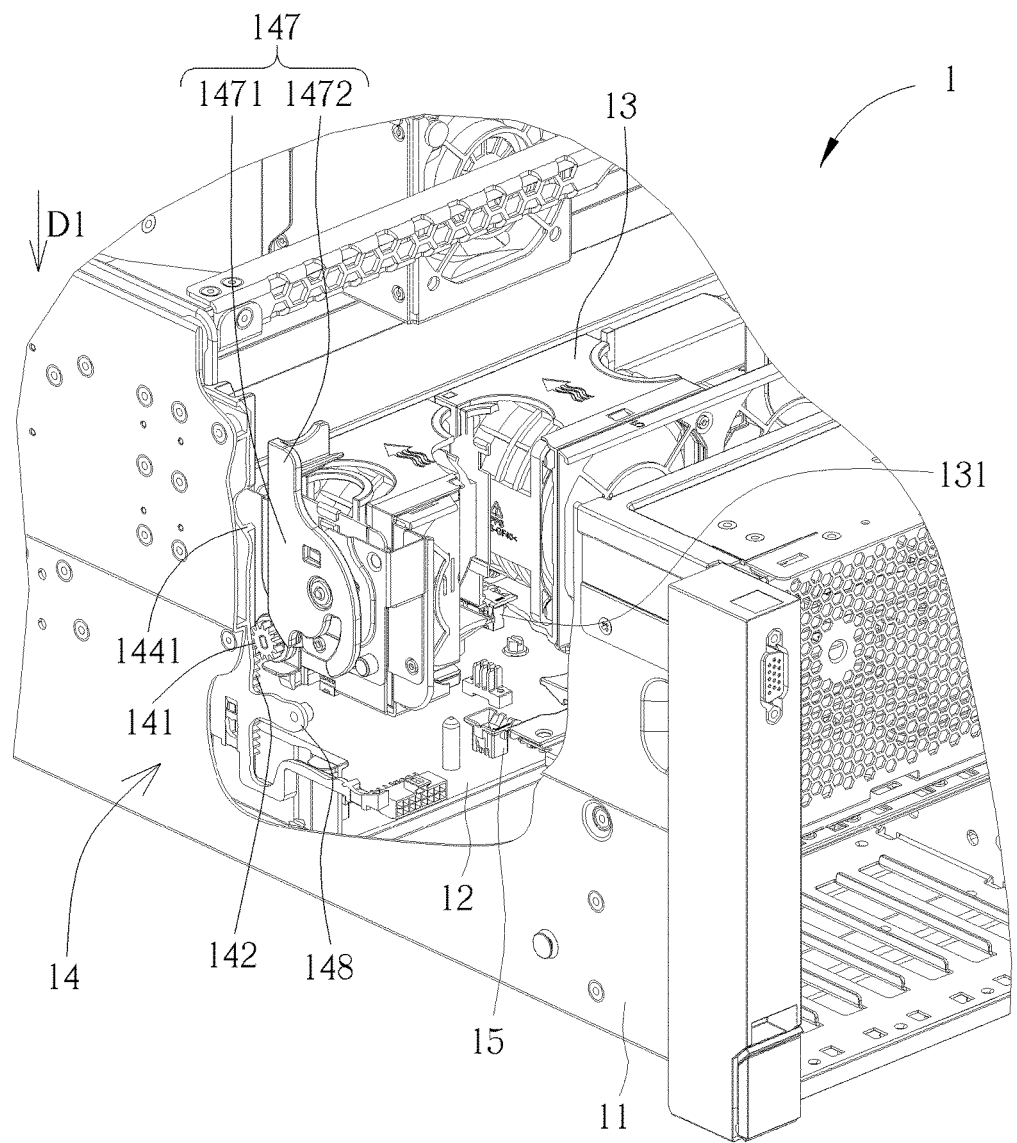
Figure 8:
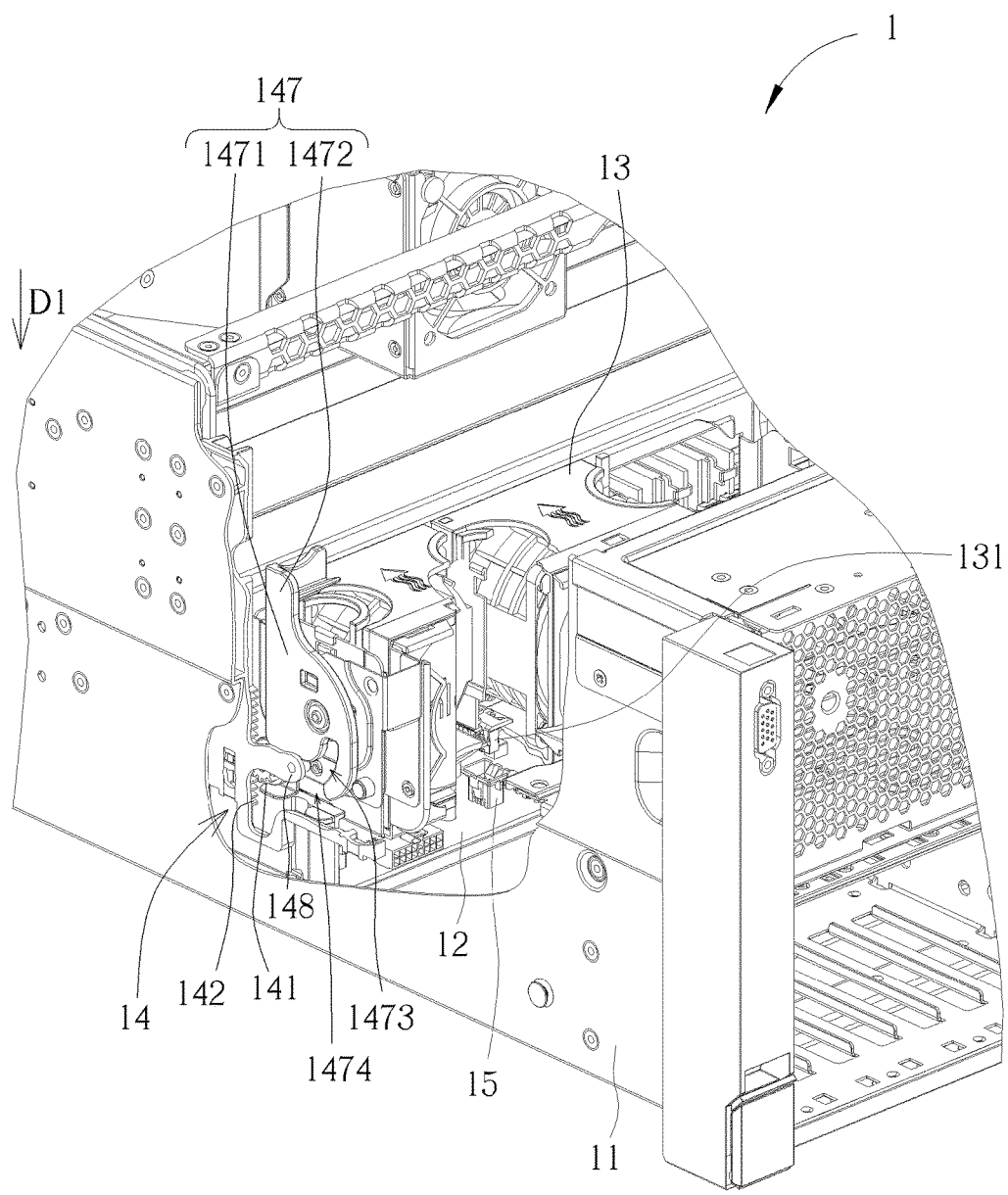
Figure 9:
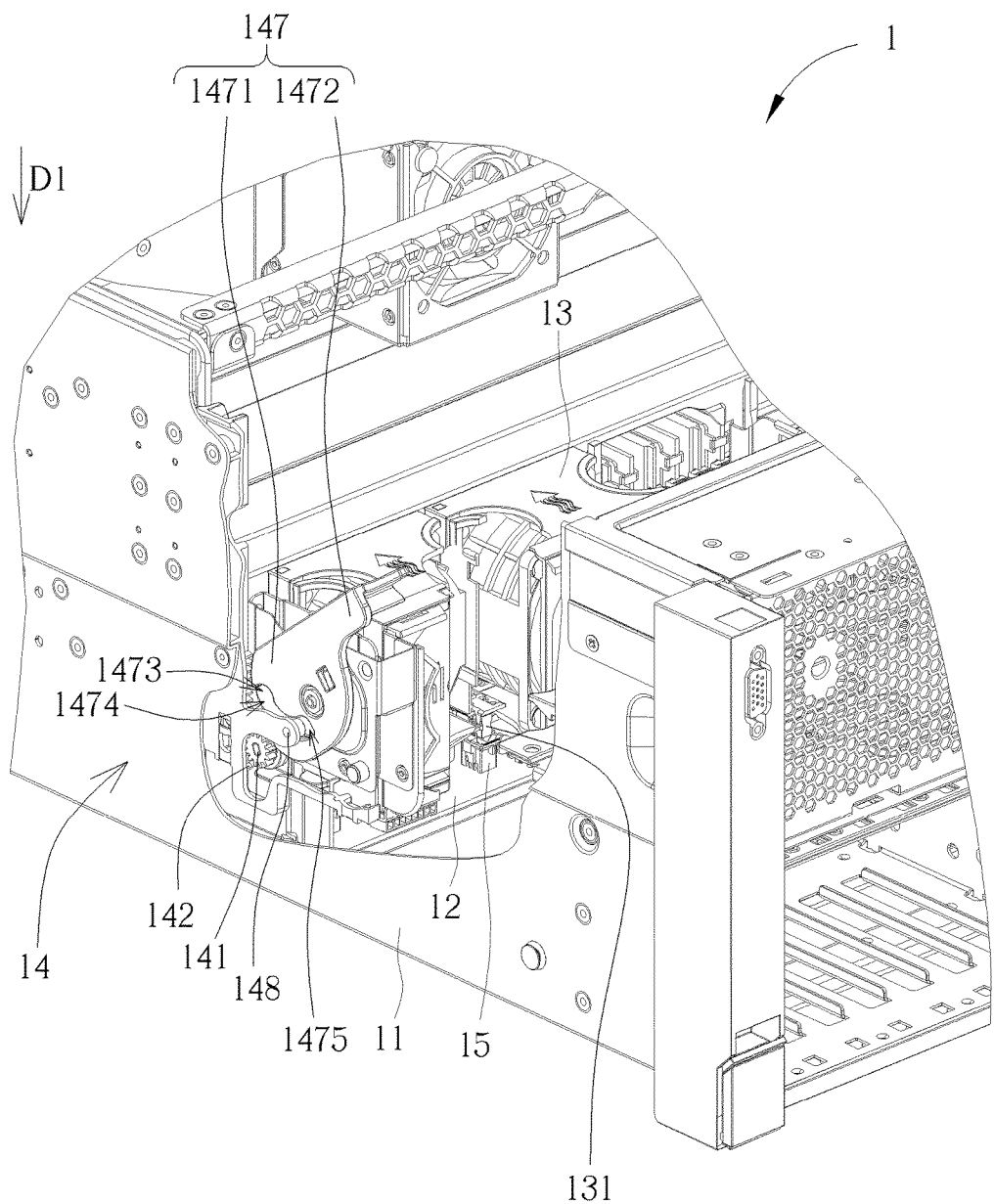
Figure 10:
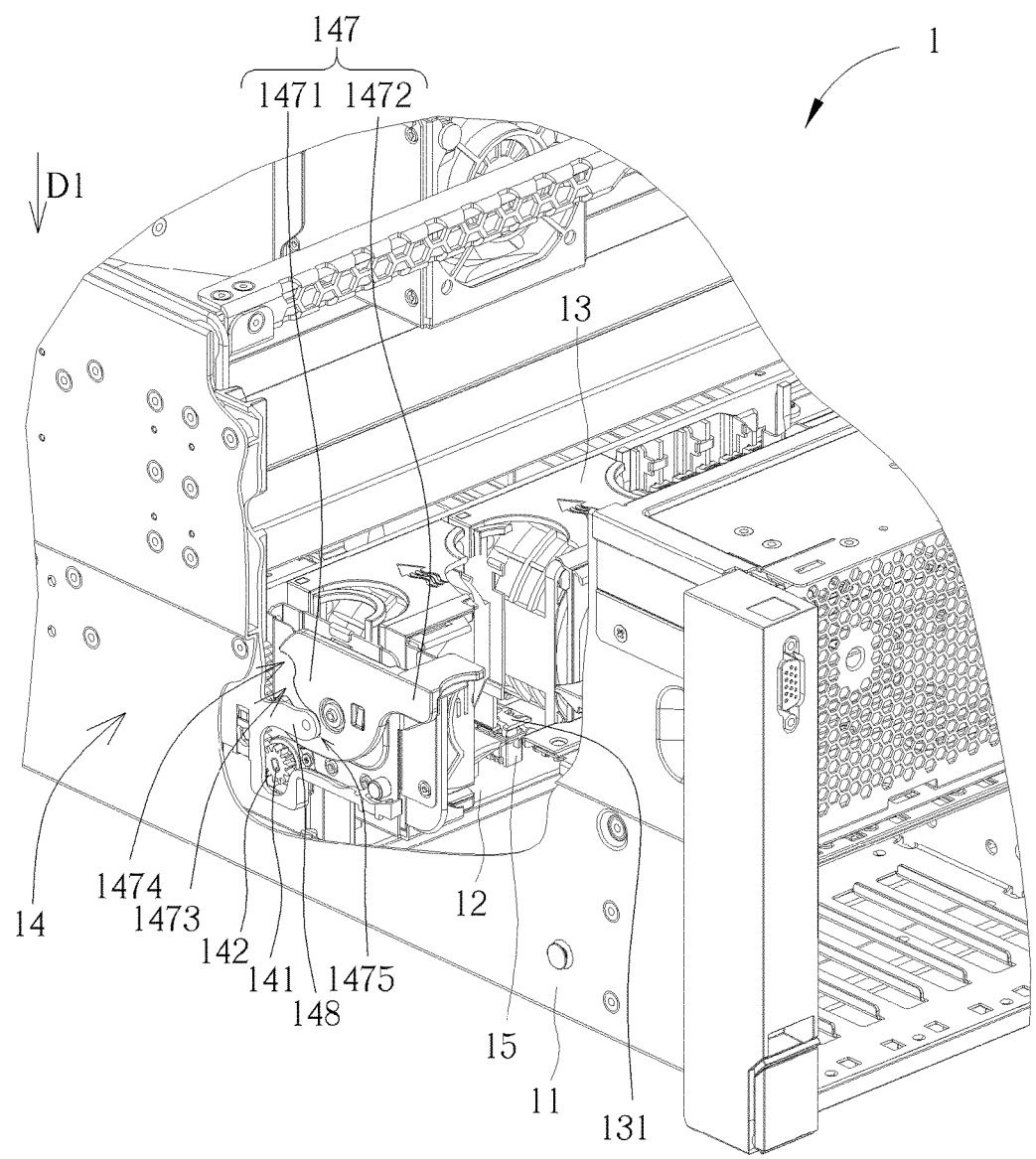

Refer to FIG. 6 to FIG. 10. FIG. 6 to FIG. 10 are diagrams of the electronic device 1 in different states according to the first embodiment of the present disclosure. In order to illustrate operational principle of the present disclosure more specifically, FIG. 6 to FIG. 10 illustrate only partial components of the electronic device 1. In this embodiment, when the users desire to install the electronic component 13 along the first direction D1, the operating handle 147 may be pivoted to a first position as shown in FIG. 6. In other words, the opening end 1474 of the slot structure 1473 faces toward the supporting structure 148. Afterwards, the two guiding columns 1431, 1432 may enter into the guiding track 1441 via the trumpet-shaped opening structure 1442. When the electronic component 13 is guided to a position, as shown in FIG. 7, along the first direction D1 by cooperation of the guiding columns 1431, 1432 and the guiding track 1441, the damping gear 141 may rotatably engage with the gear rack 142. When the electronic component 13 continues to move to a position as shown in FIG. 8 along the first direction D1, the supporting structure 148 enters into the slot structure 1473 via the opening end 1474 of the slot structure 1473 and abuts against a wall of the slot structure 1473. At this moment, the electronic component 13 has not reached the installation position yet. In other words, the second electrical connectors 131 and the first electrical connectors 15 do not contact with each other and are separated from each other. Afterwards, when the operating portion 1472 is pivoted from the first position as shown in FIG. 8 to a second position as shown in FIG. 10, the supporting structure 148 may move from the opening end 1474 to the closed end 1475 of the slot structure 1473 along the wall of the slot structure 1473. Since the slot structure 1473 is of arc-shaped and the distance between the slot structure 1473 and the pivoting shaft 1476 of the pivoting portion 1471 gradually decreases from the opening end 1474 to the closed end 1475, during a process that the operating portion 1472 is pivoted from the first position, as shown in FIG. 8, to the second position, as shown in FIG. 10, the operating portion 1472 may provide the supporting structure 148 with a upward force along a direction opposite to the first direction D1 by cooperation of the supporting structure 148 and the wall of the slot structure 1473. A counterforce of the upward force drives the electronic component 13 to move downwardly along the first direction D1 to the installation position, so as to mate the second electrical connectors 131 with the first electrical connectors 15. Installation of the electronic component 13 is completed. Besides, abutting of the supporting structure 148 and the wall of the slot structure 1473 may partially support the electronic component 13 upwardly.

Furthermore, when is the users desire to detach the electronic component 13 from the baseplate 12 upwardly along a direction opposite to the first direction D1, the operating portion 1472 may be pivoted from the second position, as shown in FIG. 10, to the first position, as shown in FIG. 8, so that the supporting structure 148 may move from the closed end 1475 of the slot structure 1473 to the opening end 1474 of the slot structure 1473 along the wall of the slot structure 1473. Since the distance between the slot structure 1473 and the pivoting shaft 1476 of the pivoting portion 1471 decreases gradually from the opening end 1474 to the closed end 1475, the operating portion 1472 may provide the supporting structure 148 with a downward force along the first direction D1. A counterforce of the downward force drives the electronic component 13 to move upwardly along the direction opposite to the first direction D1 to move from the installation position, so as to disengage the second electrical connectors 131 from the first electrical connectors 15. When the second electrical connectors 131 and the first electrical connectors 15 are disengaged from each other, the users may take out the electronic component 13 from the casing 11 along the direction opposite to the first direction D1 to accomplish disassembly of the electronic component 13.

It should be noticed that during the aforementioned installation or disassembling process, if the electronic component 13 falls due to an accidental mistake, rotatory engagement of the damping gear 141 and the gear rack 142 may reduce the kinetic energy of the falling electronic component 13 to reduce the falling speed of the electronic component 13. Therefore, it may prevent the electronic component 13 from rapidly colliding with the baseplate 12 or other internal components. Furthermore, during a process that the electronic component 13 moves along the first direction D1, the supporting structure 148 abuts against the opening end 1474 of the slot structure 1473 of the operating handle 147 firstly. At this moment, the second electrical connectors 131 of the electronic component 13 are still separated from the first electrical connectors 15 disposed on the baseplate 12. Afterwards, when the operating handle 147 is pivoted to drive the supporting structure 148 to move to the closed end 1475 of the slot structure 1473 of the operating handle 147, the second electrical connectors 131 of the electronic component 13 are driven to mate with the first electrical connectors 15 disposed on the baseplate 12. Therefore, it may prevent the first electrical connectors 15 or the second electrical connectors 131 from collision damage.

Figure 11:
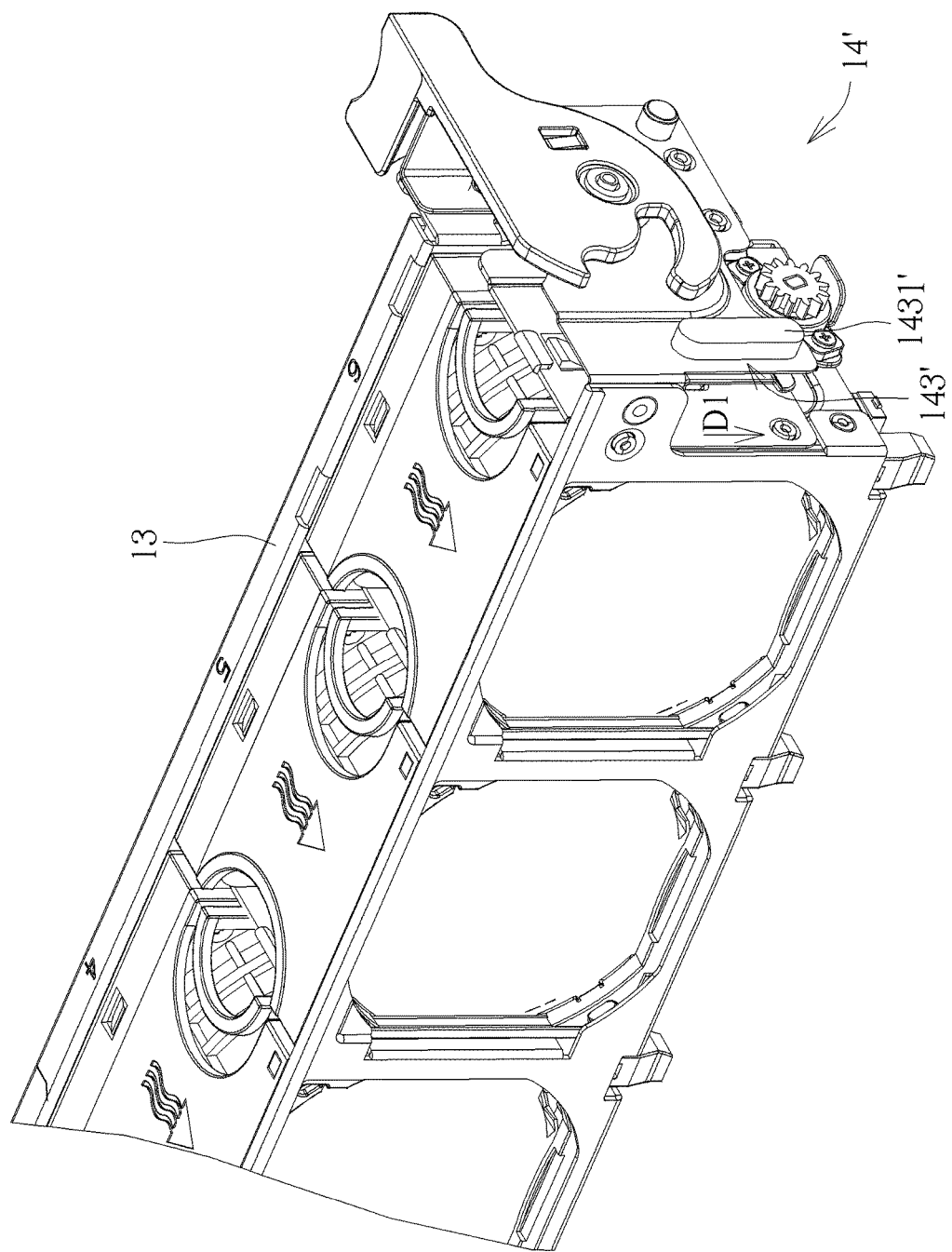
FIG. 11 is a diagram of an electronic component and an anti-falling mechanism according to a second embodiment of the present disclosure.

However, the anti-falling mechanism of the present disclosure is not limited to the aforementioned embodiment. For example, refer to FIG. 11. FIG. 11 is a diagram of the electronic component 13 and an anti-falling mechanism 14' according to a second embodiment of the present disclosure. Differences between the anti-falling mechanism 14 of the present embodiment and the anti-falling mechanism 14' of the aforementioned embodiment reside in that a first guiding structure 143' of the anti-falling mechanism 14' of this embodiment may include a sliding block 1431'. A longitudinal direction of the sliding block 1431' is substantially parallel to the first direction D1. Therefore, the damping gear 141 may move along the first direction D1 to rotatably engage with the gear rack 142 by cooperation of the sliding block 1431' and the guiding track 1441. Other structure and operational principle of this embodiment are similar to those of the aforementioned embodiment. Detail description is omitted herein for simplicity.

Figure 12:
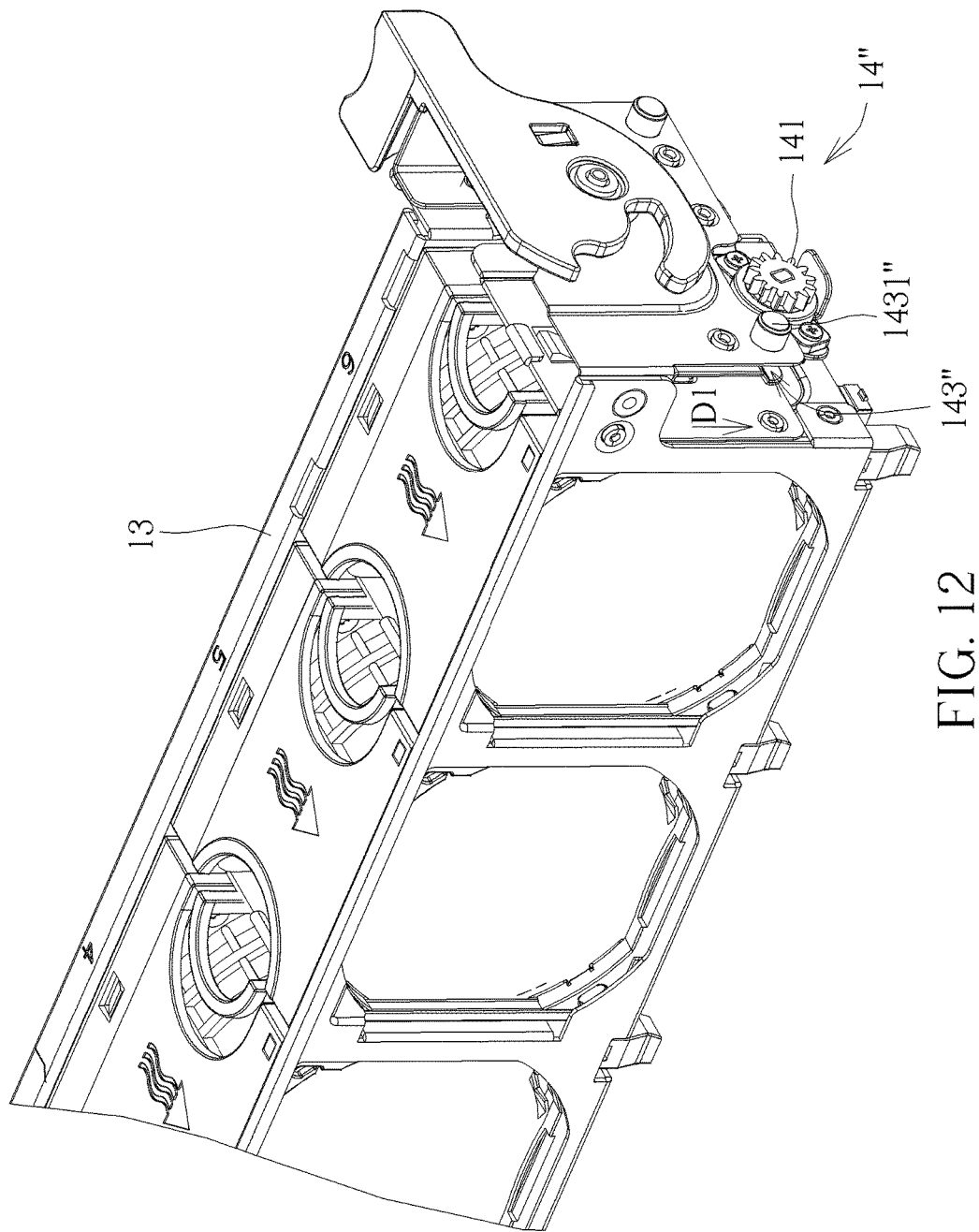
FIG. 12 is a diagram of an electronic component and an anti-falling mechanism according to a third embodiment of the present disclosure.
Figure 13:
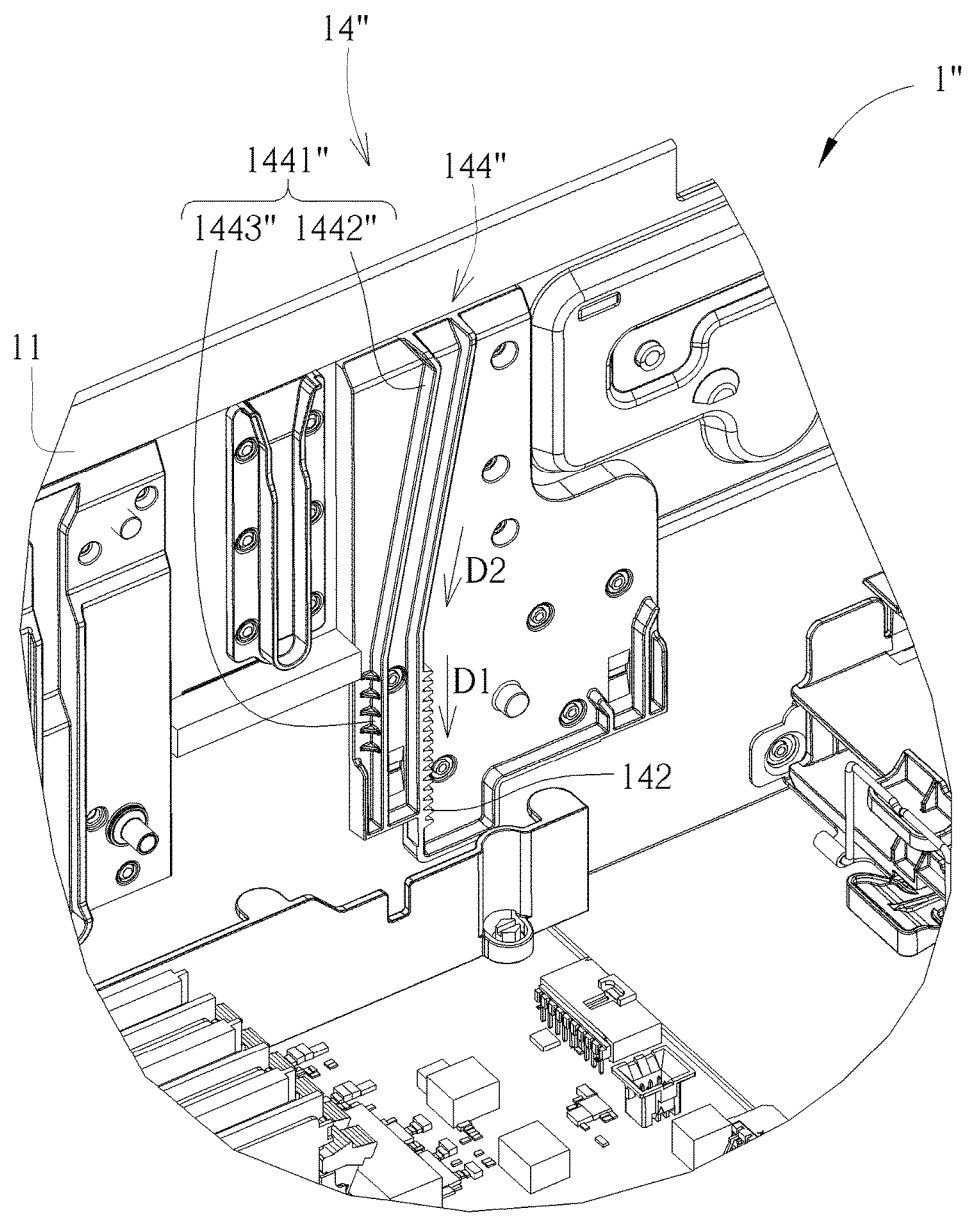
FIG. 13 is a diagram of an inner side of a casing of an electronic device according to the third embodiment of the present disclosure.

Refer to FIG. 12 and FIG. 13. FIG. 12 is a diagram of the electronic component 13 and an anti-falling mechanism 14" according to a third embodiment of the present disclosure. FIG. 13 is a diagram of an inner side of the casing 11 of an electronic device 1" according to the third embodiment of the present disclosure. As shown in FIG. 12 and FIG. 13, differences between the anti-falling mechanisms 14, 14' of the aforementioned embodiments and the anti-falling mechanism 14" of the present embodiment reside in that a first guiding structure 143" of the anti-falling mechanism 14" of this embodiment may include a guiding column 1431". A second guiding structure 144" of the anti-falling mechanism 14" may include a guiding track 1441". The guiding track 1441" includes a first section 1442" and a second section 1443". The first section 1442" extends along a second direction D2, which is not parallel to the first direction D1. The second section 1443" extends along the first direction D1. The gear rack 142 is disposed on a side of the second section 1443" of the guiding track 1441" and extends along the first direction D1. When the guiding column 1431" passes through the first section 1442" of the guiding track 1441", the electronic component 13 may be guided to move along the second direction D2. When the guiding column 1431" passes through the second section 1443" of the guiding track 1441", the electronic component 13 may be guided to move along the first direction D1, so that the damping gear 141 may rotatably engage with the gear rack 142 along the first direction D1. The first section 1442" of the guiding track 1441" extending along the second direction D2 which is not parallel to the first direction D1, which may drive the electronic component 13 to move along a direction perpendicular to the first direction D1, which may facilitate to reduce the vertical falling speed of the electronic component 13. Furthermore, in another embodiment, the gear rack 142 also may extend from a side of the first section 1442" of the guiding track 1441" to a side of the second section 1443" of the guiding track 1441". Alternatively, in another embodiment, the first guiding structure 143" may include a sliding block. A longitudinal direction of the sliding block may extend along the second direction D2, and the second section 1443" may extend the second direction D2. That is, the damping gear 141 may rotatably engage with the gear rack 142 along the second direction D2, which is not parallel to the first direction D1, i.e., a falling direction of the electronic component 13. Besides, in another embodiment, the first guiding structure may include two guiding columns, and the second guiding structure may include two guiding tracks.

Figure 14:
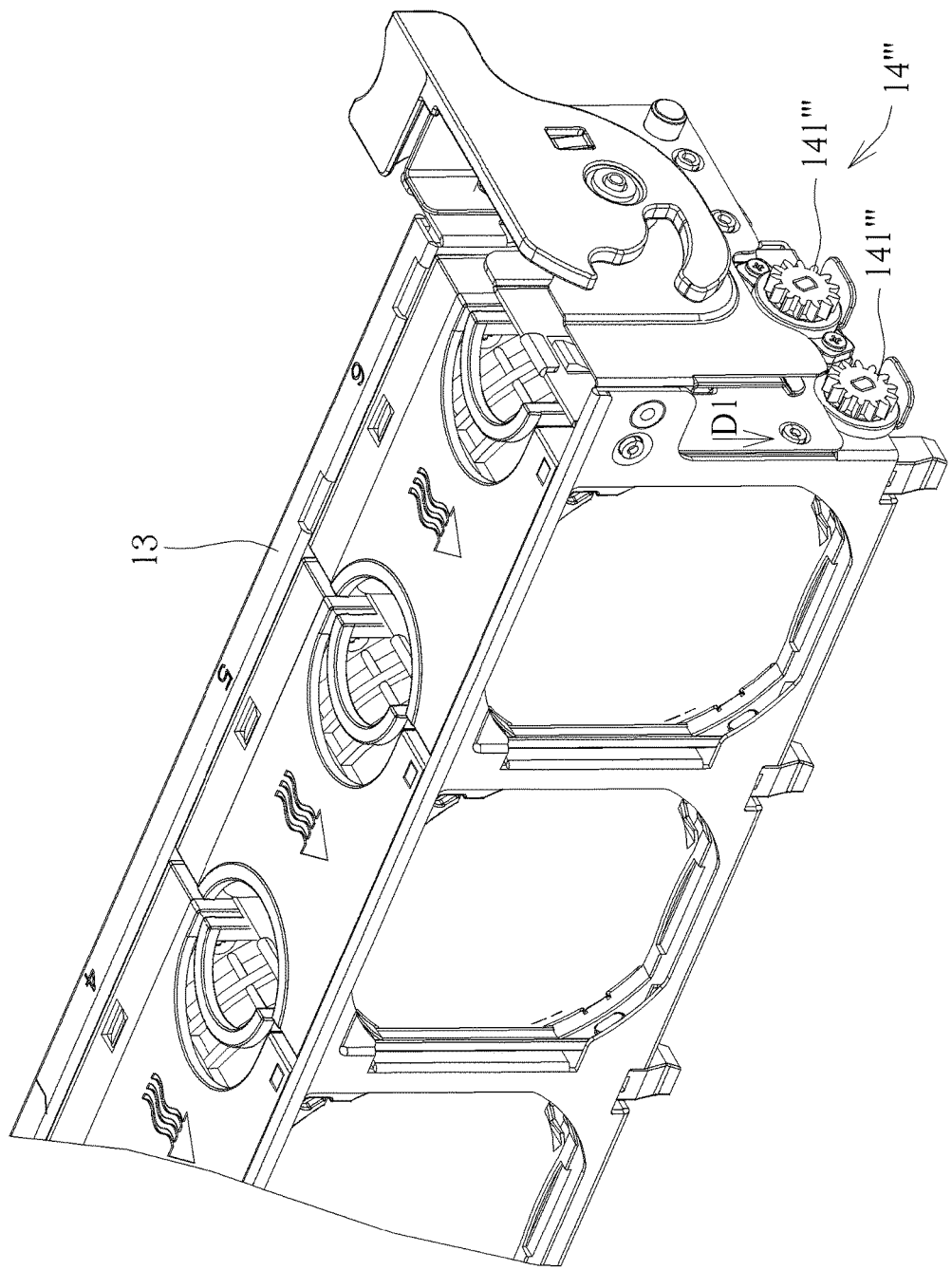
FIG. 14 is a diagram of an electronic component and an anti-falling mechanism according to a fourth embodiment of the present disclosure.
Figure 15:
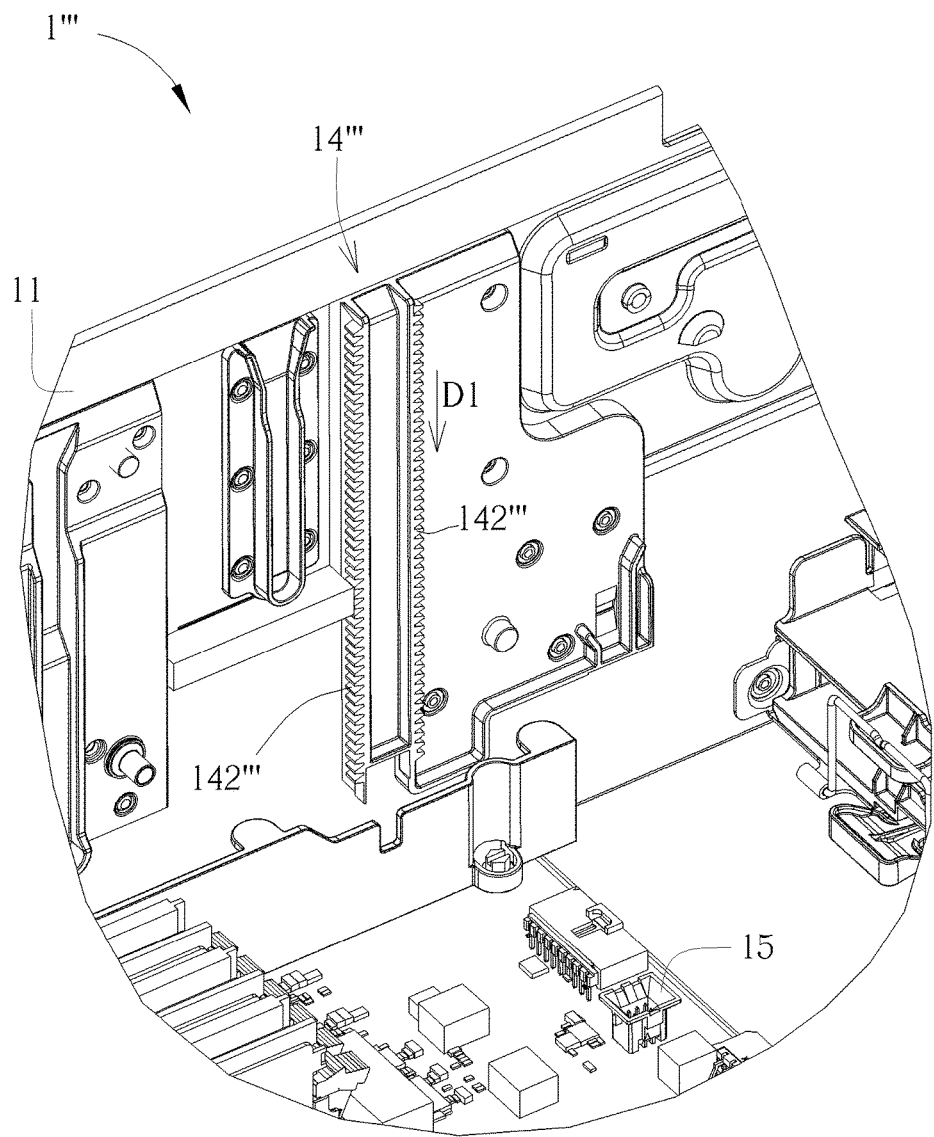
FIG. 15 is a diagram of an inner side of a casing of an electronic device according to the fourth embodiment of the present disclosure.

Refer to FIG. 14 and FIG. 15. FIG. 14 is a diagram of the electronic component 13 and an anti-falling mechanism 14''' according to a fourth embodiment of the present disclosure. FIG. 15 is a diagram of an inner side of the casing 11 of an electronic device 1''' according to the fourth embodiment of the present disclosure. As shown in FIG. 14 and FIG. 15, differences between the anti-falling mechanisms 14, 14', 14" of the aforementioned embodiments and the anti-falling mechanism 14''' of the present embodiment reside in that the anti-falling mechanism 14''' of this embodiment include two damping gears 141''' and two gear racks 142'''. The two gear racks 142" are disposed on the inner side of the casing 11 along the first direction D1 and parallel to each other. When the two damping gears 141''' rotatably engage with the two gear racks 142''', the electronic component 13 may be guided to move along the first direction D1. That is, the electronic component 13 may be guided to move along the first direction D1 by cooperation of the two damping gears 141''' and the two gear racks 142'''. Therefore, in this embodiment, the first guiding structure and the second guiding structure may be omitted. However, in another embodiment, the anti-falling mechanism 14''' still may include first guiding structure and the second guiding structure. It depends on practical demands.

In contrast to the prior art, the present disclosure utilizes rotary engagement of the damping gear and the gear rack for reducing the kinetic energy of the falling electronic component. In such a way, even if the electronic component accidentally falls during installation, the electronic component may fall downwardly in a slow and steady speed. Since the kinetic energy of the falling electronic component is reduced, it may prevent the electronic component and other component located beneath from collision damage, which may improve assembly yield. Furthermore, the present disclosure further utilizes cooperation of the first guiding structure and the second guiding structure for guiding the damping gear to rotatably engage with the gear rack. Therefore, it is convenient in use. Besides, the present disclosure further utilizes the supporting structure and the operating handle for mating the first electrical connector and the second electrical connector. As the electronic component falls in the slow and steady speed, the supporting structure on the casing may abut against the opening end of the slot structure of the operating handle. At this moment, the second electrical connector of the electronic component is separated from the first electrical connector disposed on the baseplate. Afterwards, when the operating handle is pivoted to drive the electronic component to move toward the baseplate and to drive supporting structure to move toward the closed end of the slot structure, the second electrical connector of the electronic component is driven to mate with the first electrical connector disposed on the baseplate. Therefore, it may effectively prevent the first electrical connector and the second electrical connector from collision damage during installation.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An anti-falling mechanism for preventing an electronic component installed inside a casing from falling rapidly, the anti-falling mechanism comprising:
   at least one damping gear disposed on the electronic component;
   at least one gear rack disposed at a position corresponding to the at least one damping gear, the at least one damping gear rotatably engaging with the at least one gear rack for reducing kinetic energy of the falling electronic component when the electronic component is being installed inside the casing at least along a first direction;
   an operating handle comprising a pivoting portion pivoted to the electronic component, the pivoting portion comprising a slot structure having an opening end and a closed end; and
   a supporting structure disposed on the casing, the supporting structure entering into the slot structure via the opening end and abutting against a wall of the slot structure when the electronic component moves along the first direction to a pre-installation position.

2. The anti-falling mechanism of claim 1, wherein the at least one damping gear is disposed on a side of the electronic component adjacent to the casing, the at least one gear rack is disposed on an inner side of the casing, the anti-falling mechanism further comprises a first guiding structure and a second guiding structure, the first guiding structure is disposed on the side of the electronic component adjacent to the casing, the second guiding structure is disposed on the inner side of the casing and located at a position corresponding to the first guiding structure, and the first guiding structure cooperates with the second guiding structure for guiding the at least one damping gear to move along the first direction to rotatably engage with the at least one gear rack.

3. The anti-falling mechanism of claim 2, wherein the first guiding structure comprises at least one guiding column, the second guiding structure comprises a guiding track, and the at least one gear rack is disposed on a side of the guiding track.

4. The anti-falling mechanism of claim 3, wherein the second guiding structure further comprises a trumpet-shaped opening structure connected together with the guiding track, and the trumpet-shaped opening structure is configured to guide the at least one guiding column to enter into the guiding track.

5. The anti-falling mechanism of claim 3, wherein the first guiding structure comprises two guiding columns, the two guiding columns are arranged along the first direction, and the guiding track and the at least one gear rack extend along the first direction.

6. The anti-falling mechanism of claim 3, wherein at least one portion of the guiding track and at least one portion of the at least one gear rack extend along a direction different from the first direction.

7. The anti-falling mechanism of claim 1, wherein the anti-falling mechanism further comprises a first positioning structure and a second positioning structure, the first positioning structure is disposed on a side of the electronic component adjacent to the casing, the second positioning structure is disposed on an inner side of the casing corresponding to the first positioning structure, and the first positioning structure and the second positioning structure engage with each other when the electronic component is fixed at an installation position relative to the casing.

8. The anti-falling mechanism of claim 1, wherein the supporting structure is located within the opening end of the slot structure when the operating handle is located at a first position relative to the electronic component, the supporting structure is located within the closed end of the slot structure when the operating handle is located at a second position relative to the electronic component, and the supporting structure abuts against the wall of the slot structure when the operating handle is being pivoted from the first position to the second position.

9. The anti-falling mechanism of claim 8, wherein the slot structure is of arc-shaped, and a distance between the slot structure and a pivoting shaft of the pivoting portion gradually decreases from the opening end to the closed end.

10. The anti-falling mechanism of claim 1, comprising two damping gears and two gear racks, the two damping gears being disposed on a side of the electronic component adjacent to the casing, the two gear racks being disposed on an inner side of the casing, the two gear racks being parallel to each other and extending along the first direction, the two damping gears rotatably engaging with the two gear racks respectively for reducing the kinetic energy of the falling electronic component when the electronic component is being installed inside the casing at least along the first direction.

11. An electronic device comprising:
    a casing;
    a baseplate disposed inside the casing;
    an electronic component detachably disposed inside the casing and located above the baseplate; and
    at least one anti-falling mechanism comprising:
        at least one damping gear disposed on the electronic component;
        at least one gear rack disposed at a position corresponding to the at least one damping gear, the at least one damping gear rotatably engaging with the at least one gear rack for reducing kinetic energy of the falling electronic component when the electronic component is being installed inside the casing at least along a first direction;
        an operating handle comprising a pivoting portion pivoted to the electronic component, the pivoting portion comprising a slot structure having an opening end and a closed end; and
        a supporting structure disposed on the casing, the supporting structure entering into the slot structure via the opening end and abutting against a wall of the slot structure when the electronic component moves along the first direction to a pre-installation position.

12. The electronic device of claim 11, wherein the at least one damping gear is disposed on a side of the electronic component adjacent to the casing, the at least one gear rack is disposed on an inner side of the casing, the at least one anti-falling mechanism further comprises a first guiding structure and a second guiding structure, the first guiding structure is disposed on the side of the electronic component adjacent to the casing, the second guiding structure is disposed on the inner side of the casing and located at a position corresponding to the first guiding structure, and the first guiding structure cooperates with the second guiding structure for guiding the at least one damping gear to move along the first direction to rotatably engage with the at least one gear rack.

13. The electronic device of claim 12, wherein the first guiding structure comprises at least one guiding column, the second guiding structure comprises a guiding track, and the at least one gear rack is disposed on a side of the guiding track.

14. The electronic device of claim 13, wherein the second guiding structure further comprises a trumpet-shaped opening structure connected together with the guiding track and the trumpet-shaped opening structure is configured to guide the at least one guiding column to enter into the guiding track.

15. The electronic device of claim 13, wherein the first guiding structure comprises two guiding columns, the two guiding columns are arranged along the first direction, and the guiding track and the at least one gear rack extends along the first direction.

16. The electronic device of claim 13, wherein at least one portion of the guiding track and at least one portion of the at least one gear rack extend along a direction different from the first direction.

17. The electronic device of claim 11, wherein the at least one anti-falling mechanism further comprises a first positioning structure and a second positioning structure, the first positioning structure is disposed on a side of the electronic component adjacent to the casing, the second positioning structure is disposed on an inner side of the casing corresponding to the first positioning structure, and the first positioning structure and the second positioning structure engage with each other when the electronic component is fixed at an installation position relative to the casing.

18. The electronic device of claim 11, wherein the electronic device further comprises a first electrical connector disposed on the baseplate, the electronic component comprises a second electrical connector for mating with the first electrical connector, the supporting structure is located within the opening end of the slot structure and the second electrical connector does not contact with and is separated from the first electrical connector when the operating handle is located at a first position relative to the electronic component, the supporting structure is located within the closed end of the slot structure and the second electrical connector mates with the first electrical connector when the operating handle is located at a second position relative to the electronic component, and the supporting structure abuts against the wall of the slot structure when the operating handle is being pivoted from the first position to the second position.

19. The electronic device of claim 18, wherein the slot structure is of arc-shaped, and a distance between the slot structure and a pivoting shaft of the pivoting portion gradually decreases from the opening end to the closed end.

20. The electronic device of claim 11, wherein the anti-falling mechanism comprises two damping gears and two gear racks, the two damping gears are disposed on a side of the electronic component adjacent to the casing, the two gear racks are disposed on an inner side of the casing, the two gear racks are parallel to each other and extend along the first direction, the two damping gears rotatably engage with the two gear racks respectively for reducing the kinetic energy of the falling electronic component when the electronic component is being installed inside the casing at least along the first direction.

* * * * *